(12) United States Patent
Lin et al.

(10) Patent No.: US 8,291,956 B2
(45) Date of Patent: Oct. 23, 2012

(54) BONDING APPARATUS

(75) Inventors: Dong-Sheng Lin, Taipei Hsien (TW); Tzyy-Chyi Tsai, Taipei Hsien (TW); Jian-Jun Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 361 days.

(21) Appl. No.: 12/567,910

(22) Filed: Sep. 28, 2009

(65) Prior Publication Data

US 2011/0017405 A1    Jan. 27, 2011

(30) Foreign Application Priority Data

Jul. 24, 2009 (CN) .......................... 2009 1 0304834

(51) Int. Cl.
*B29C 65/00* (2006.01)
(52) U.S. Cl. ....................................... 156/538; 156/580
(58) Field of Classification Search .................. None
See application file for complete search history.

(56) References Cited

U.S. PATENT DOCUMENTS

| | | | | |
|---|---|---|---|---|
| 5,487,808 A | * | 1/1996 | Suzuki et al. | 156/556 |
| 5,772,839 A | * | 6/1998 | Nagate et al. | 156/522 |
| 6,241,839 B1 | * | 6/2001 | Yoshino et al. | 156/91 |
| 6,453,963 B1 | * | 9/2002 | Furukawa et al. | 156/364 |

* cited by examiner

*Primary Examiner* — Mark A Osele
*Assistant Examiner* — Nickolas Harm
(74) *Attorney, Agent, or Firm* — Altis Law Group, Inc.

(57) ABSTRACT

A bonding apparatus for bonding a first substrate and a second substrate includes a base body, a first stripping device, a second stripping device, at least two vacuum bonding devices, and a loading mechanism. The first stripping device removes a film from the first substrate, and the second stripping device removes a film from the second substrate. The at least two vacuum bonding devices are arranged on the base body and aligned with each other. The loading mechanism includes a slide-rail on the base body and an adjustment assembly slidably connected to the slide-rail. The loading mechanism transfers a first substrate and a second substrate into one vacuum bonding device, and then, sliding on the slider, transfers another first substrate and another second substrate to another vacuum bonding device.

11 Claims, 8 Drawing Sheets

BONDING APPARATUS

BACKGROUND

1. Technical Field

The present disclosure relates generally to panel fabrication and, more particularly, to a bonding apparatus used in display panel fabrication.

2. Description of Related Art

During fabrication of a liquid crystal display panel, two substrates are bonded together in a vacuum laminator. Some substrates have a flexible film attached thereon to protect the substrate, which must be removed by a stripping device before the two substrates are bonded.

A typical bonding apparatus includes a stripping device, a laminator, and a conveyer belt connecting the stripping device to the laminator. A substrate is arranged in the stripping device and delivered into the laminator to be bonded with another substrate after the protective film has been removed by the stripping device. The conveyer belt can deliver the substrate automatically from the stripping device to the laminator, so that the film removal is automated. However, stripping time is shorter than bonding time, so that the stripping device remains idle during bonding of the substrates. Thus, the stripping device has relatively low utilization and manufacturing efficiency.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
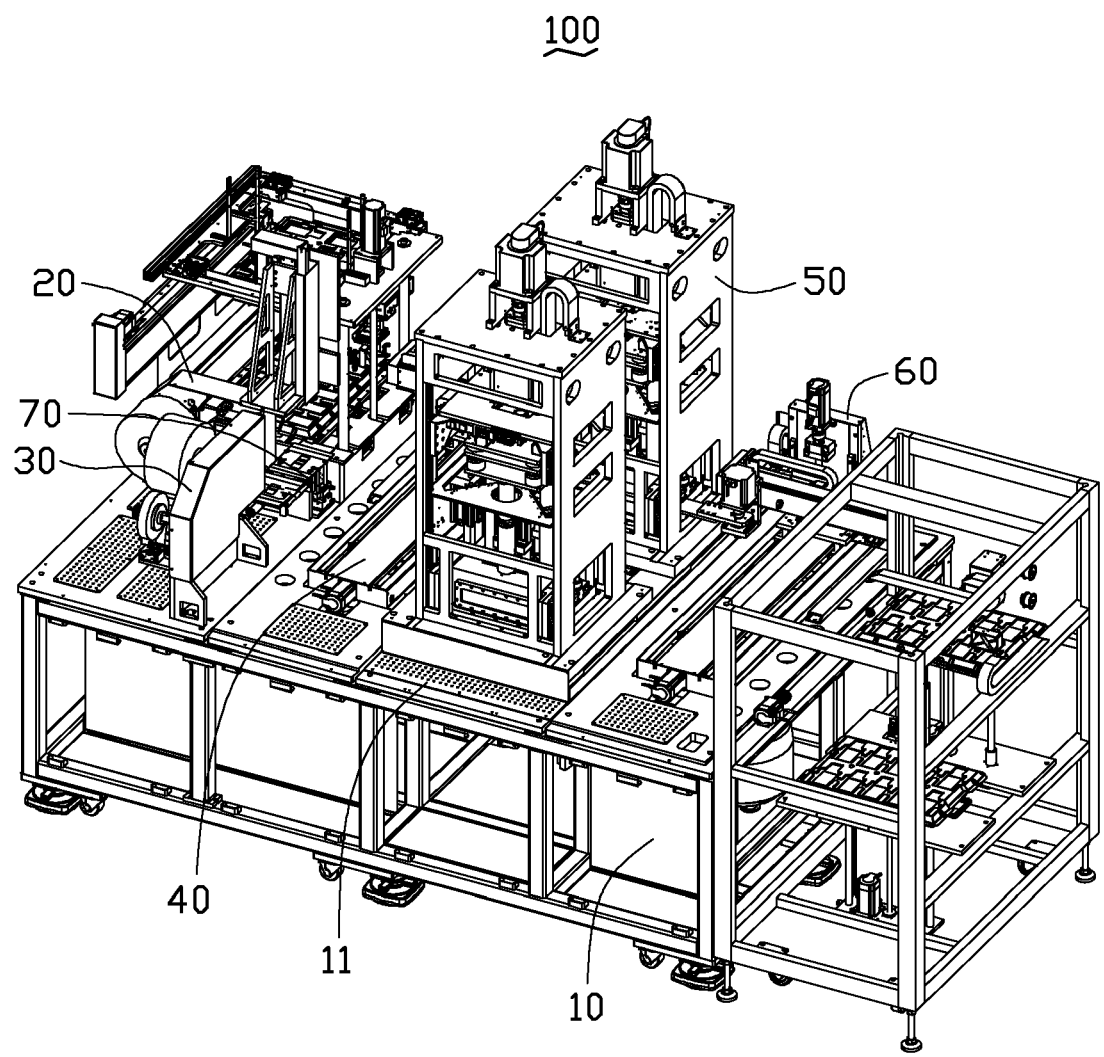
FIG. 1 is an assembled, isometric view of an embodiment of a bonding apparatus, including a base body, a loading mechanism, and at least two vacuum laminators.
Figure 2:
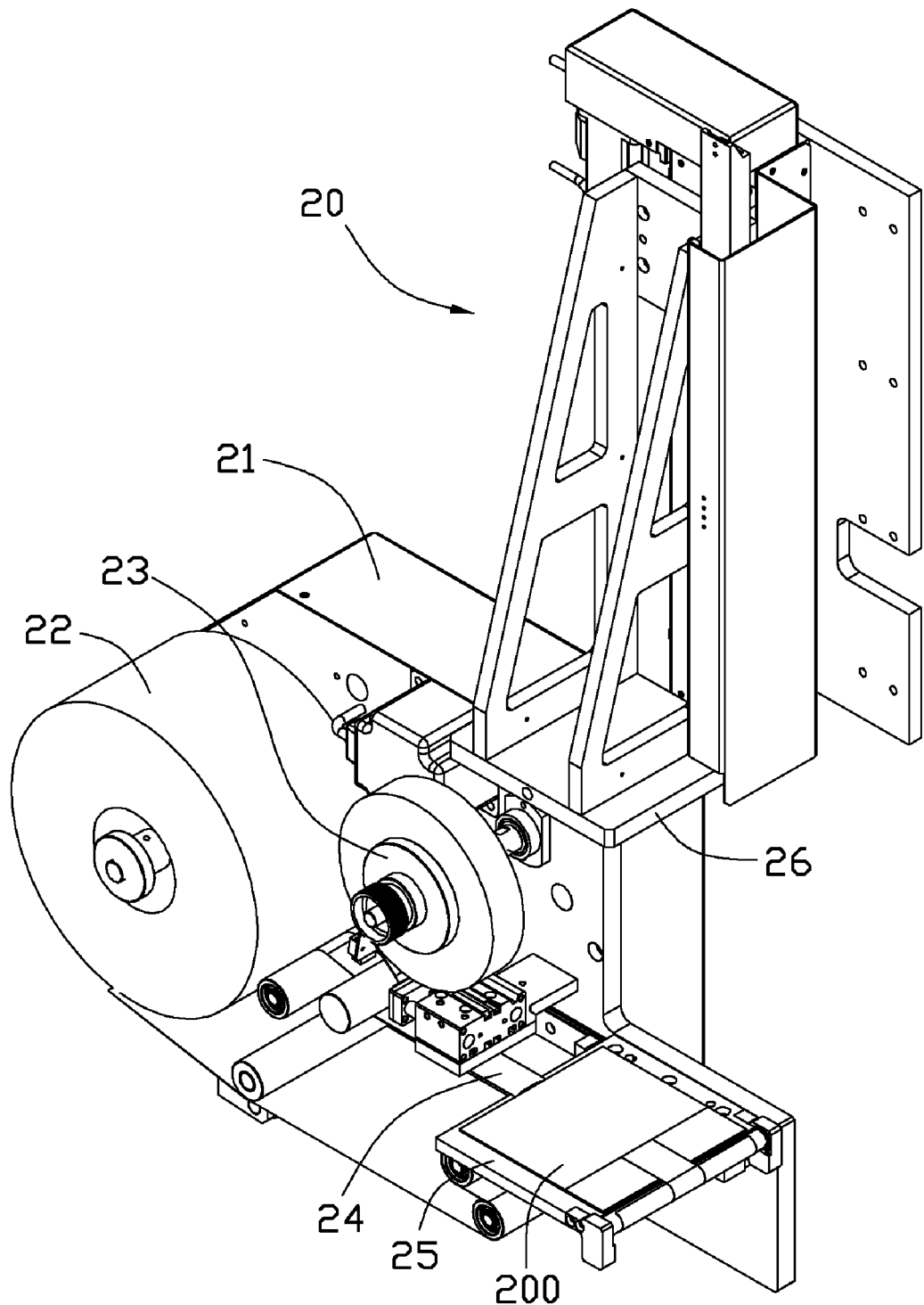
FIG. 2 is an assembled, isometric view of a first stripping device of the bonding apparatus in FIG. 1.
Figure 3:
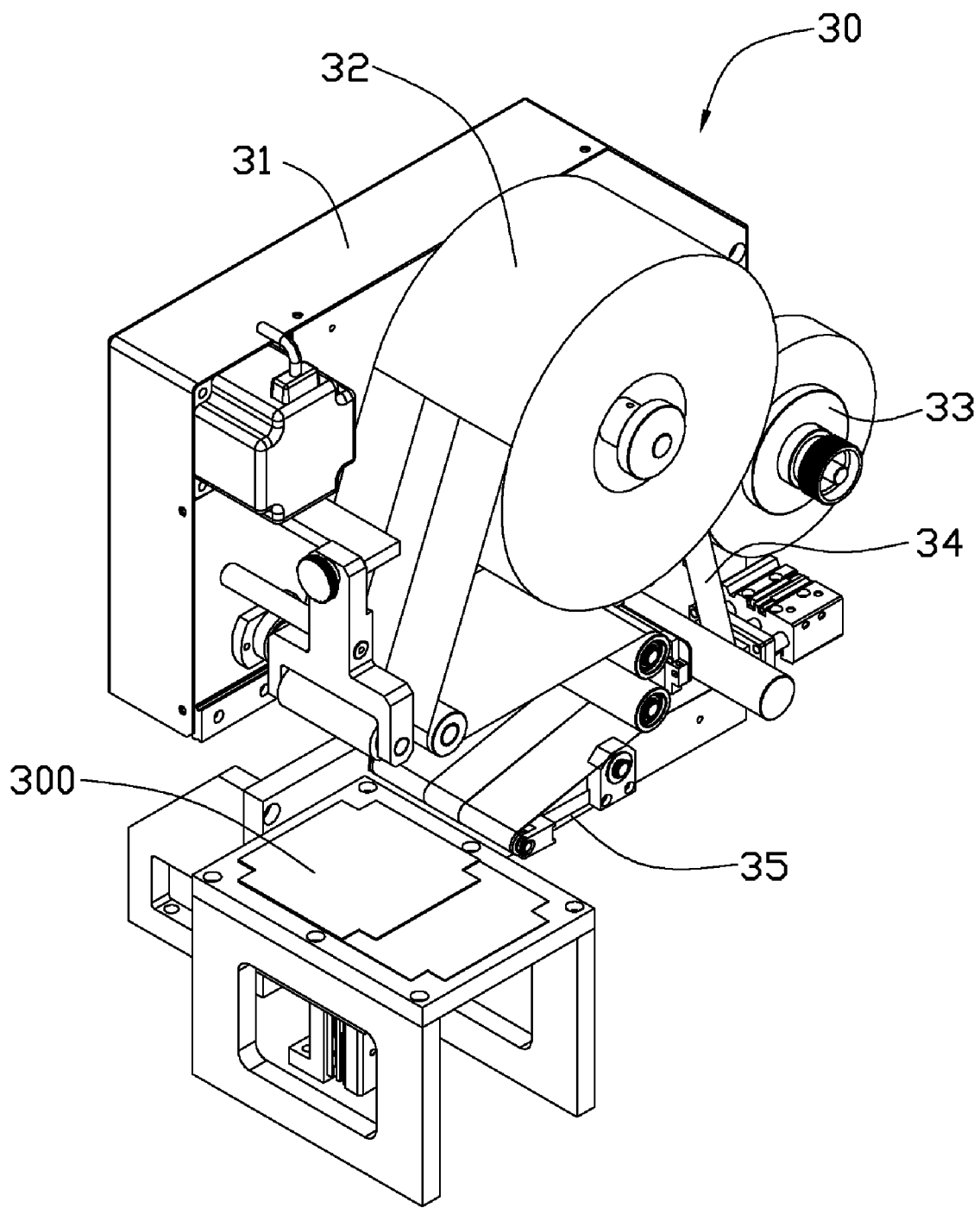
FIG. 3 is an assembled, isometric view of a second stripping device of the bonding apparatus in FIG. 1.

FIG. 1 shows an embodiment of a bonding apparatus 100 for bonding a first substrate 200 (shown in FIG. 2) and a second substrate 300 (shown in FIG. 3). The bonding apparatus 100 includes a base body 10, a first stripping device 20, a second stripping device 30, a loading mechanism 40, a plurality of vacuum laminators 50, an unloading mechanism 60, and a positioning mechanism 70. The loading mechanism 40 and the unloading mechanism 60 are arranged at opposite sides of the vacuum laminator 50.

Referring to FIGS. 2 and 3, the first substrate 200 and the second substrate 300 shown in the illustrated embodiment are glass plates. The first substrate 200 and the second substrate 300 each have a film (not labeled) attached thereon.

Referring to FIG. 1, the base body 10 loads the first stripping device 20, the second stripping device 30, the loading mechanism 40, the vacuum laminators 50, the unloading mechanism 60, and the positioning mechanism 70. The base body 10 has a working surface 11.

Referring to FIGS. 1 and 2, the first stripping device 20 is arranged on the working surface 11 of the base body 10 to remove a film from the first substrate 200. The first stripping device 20 includes a fixing bracket 21 substantially perpendicularly arranged on the working surface 11 of the base body 10, a material collecting member 22, a material discharging member 23, an adhesive tape 24 around the discharging member 23, a stripping plate 25 movably connecting with the fixing bracket 21, and a pressing member 26 arranged above the fixing bracket 21. The pressing member 26 can move relative to the stripping plate 25. When a first substrate 200 is positioned on the stripping plate 25 and pressed by the pressing member 26, the stripping plate 25 moves, and the adhesive tape 24 contacts and strips the protective film of the first substrate 200. The material collecting member 22 then collects the removed protective film.

Referring to FIGS. 1 and 3, the second stripping device 30 is arranged on the working surface 11 of the base body 10 to remove a film from the second substrate 300. Structure of the second stripping device 30 is substantially the same as the first stripping device 20. The second stripping device 30 includes a fixing bracket 31, a material collecting member 32, a material discharging member 33, an adhesive tape 34 around the discharging member 33, and a stripping plate 35 movably connecting with the fixing bracket 31. When a second substrate 300 is positioned on the stripping plate 35, the stripping plate 35 moves to the material discharging member 33, the adhesive tape 34 on the material discharging member 33 strips the protective film from the second substrate 300, and the material collecting member 32 collects the removed protective film.

Figure 4:
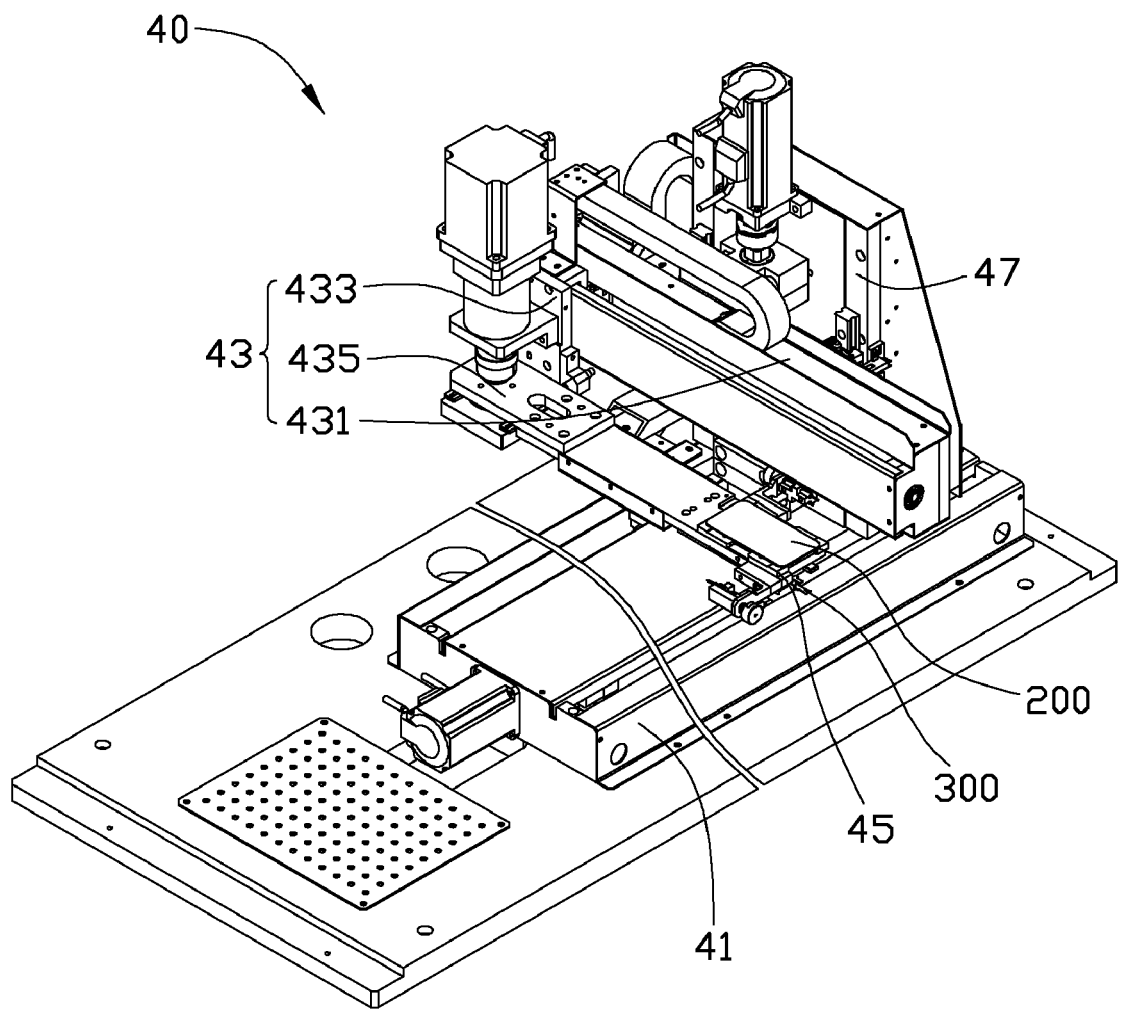
FIG. 4 is an assembled, isometric view of a loading mechanism of the bonding apparatus in FIG. 1.
Figure 5:
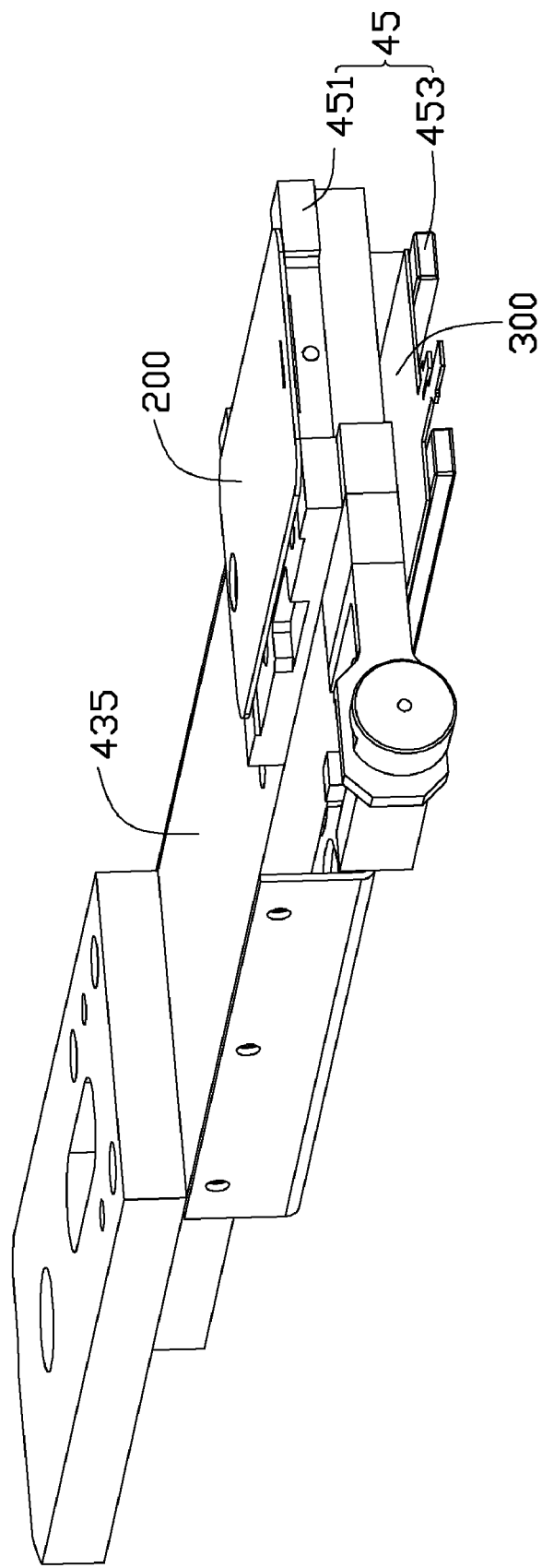
FIG. 5 is an assembled, isometric view of a loading member loading a first substrate and a second substrate in FIG. 4.

Referring to FIGS. 1, 4 and 5, the loading mechanism 40 includes a slide-rail 41 on the working surface 11 of the base body 10, an adjustment assembly 43 slidably connecting with the slide-rail 41, a loading member 45 connecting with the adjustment assembly 43, and a guiding member 47 substantially perpendicularly arranged on the working surface 11 of the base body 10. The adjustment assembly 43 includes a first slider 431, a second slider 433 slidably connecting with the first slider 431, and a rotator 435 rotatably connecting with the second slider 433. The first slider 431 can slide up and down relative to the working surface 11 of the base body 10 along the guiding member 47. The second slider 433 can slide along the first slider 431 and move with the first slider 431 so that the second slider 433 can slide laterally or up and down relative to the working surface 11 of the base body 10, the rotator 435 can move with the first slider 431 and the second slider 433, and also rotate around the second slider 433. The loading member 45 includes a first loading plate 451 and a second loading plate 453, for receiving a first substrate 200 and a second substrate 300 respectively.

Figure 6:
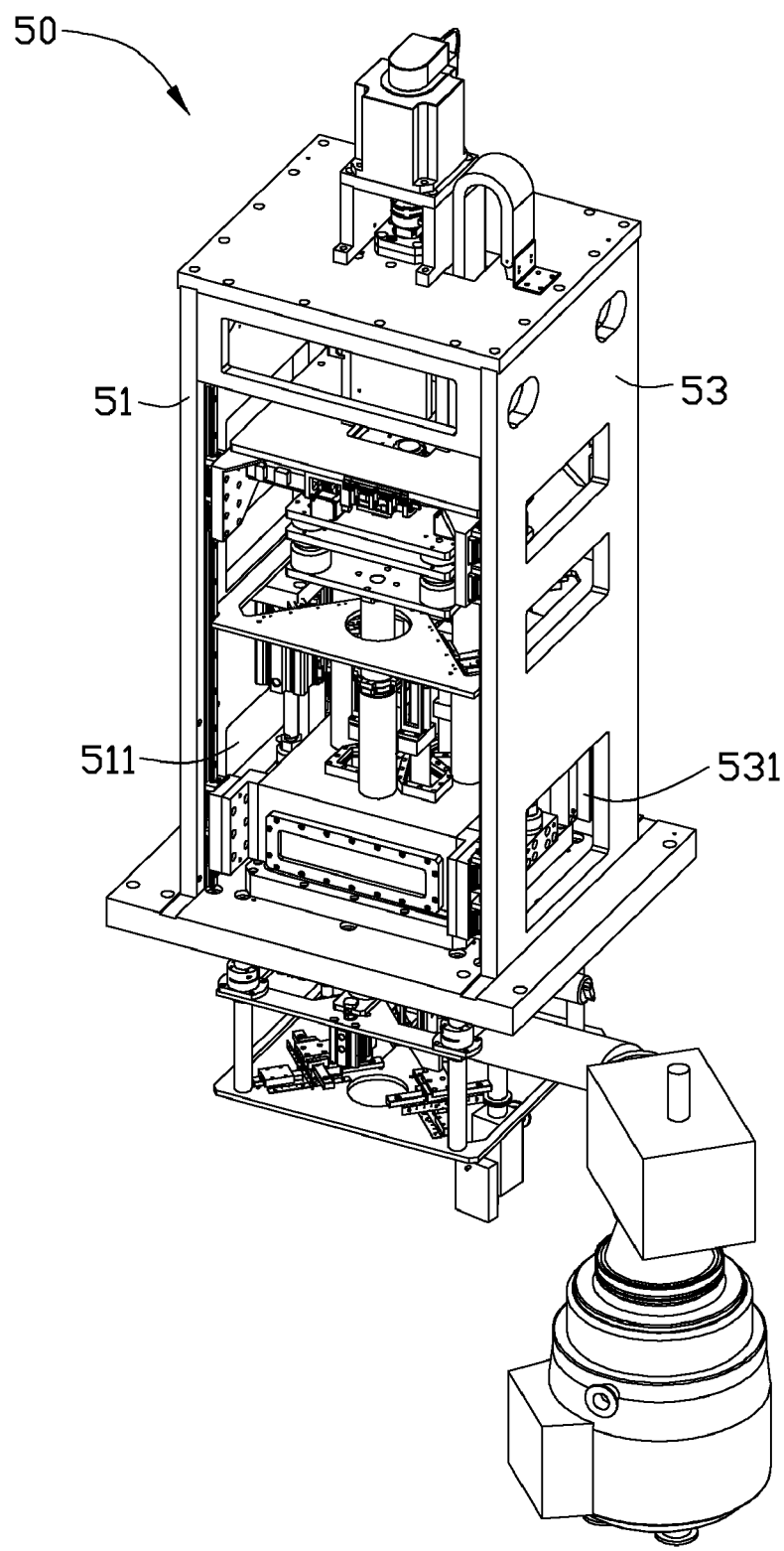
FIG. 6 is an assembled, isometric view of a vacuum laminator of the bonding apparatus in FIG. 1.

Referring to FIGS. 1, 4 and 6, two vacuum laminators 50 are shown, arranged substantially parallel to the slide-rail 41 of the loading mechanism 40. Each vacuum laminator 50 has a first sidewall 51 and a second sidewall 53 opposite to each other. The first sidewall 51 is adjacent to the loading mechanism 40 and defines an entrance 511. The second sidewall 53 is adjacent to the unloading mechanism 60 and defines an exit 531. A first substrate 200 and a second substrate 300 can be delivered into a vacuum laminator 50 via the entrance 511 of the first sidewall 51 and bonded together to form a substrate A. The substrate A is removed via the exit 531 of the second sidewall 53. The exit 531 may alternatively be defined on the first sidewall 51 rather than the second sidewall 53.

Figure 7:
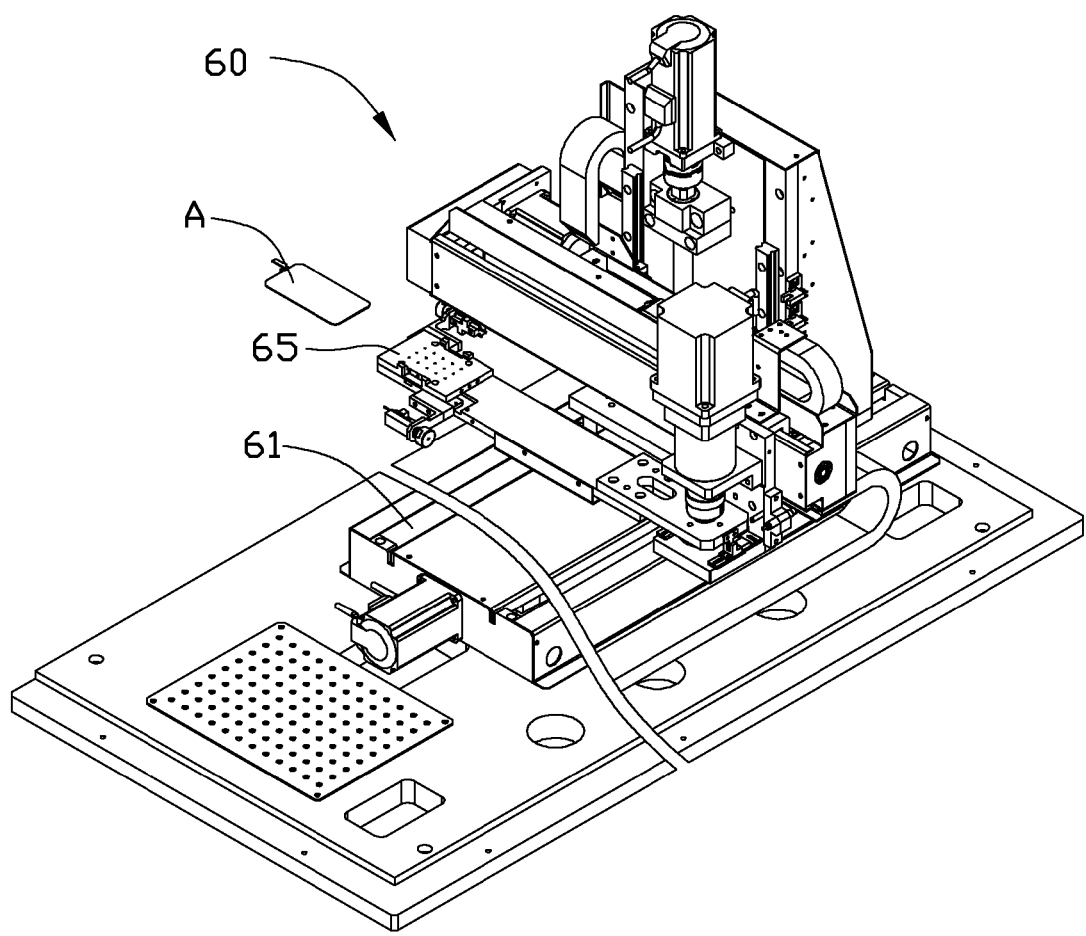
FIG. 7 is an assembled, isometric view of an unloading mechanism of the bonding apparatus in FIG. 1.

Referring to FIGS. 1 and 7, the unloading mechanism 60 is substantially the same as the loading mechanism 40, and includes a slide-rail 61 on the working surface 11 of the base body 10 and an unloading member 65. The unloading member 65 has one unloading plate. The unloading mechanism 60 removes substrate A via the exit 531 of the second sidewall 53 of a vacuum laminator 50.

Figure 8:
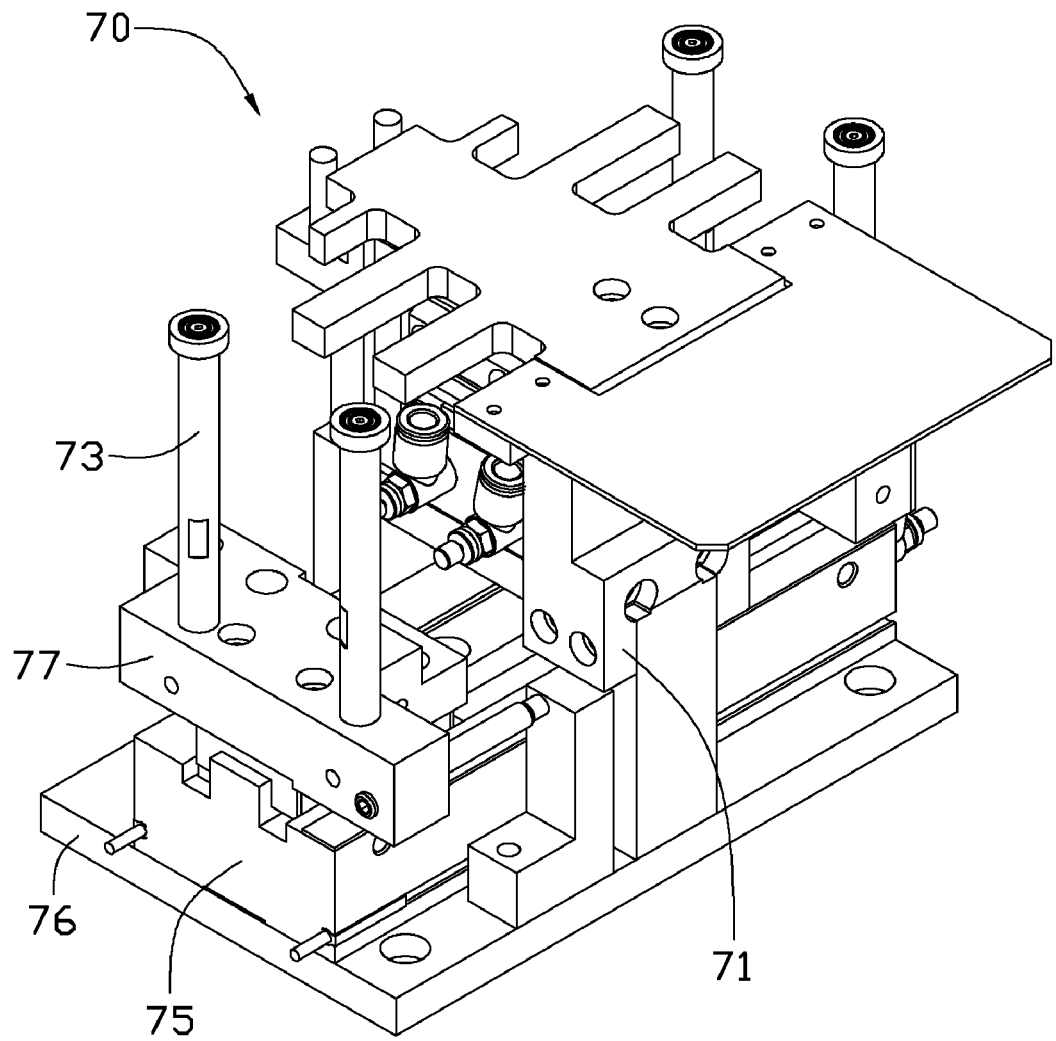
FIG. 8 is an assembled, isometric view of a positioning mechanism of the bonding apparatus in FIG. 1.

Referring to FIGS. 1 and 8, the positioning mechanism 70 is arranged on the working surface 11 of the base body 10, adjacent to the first stripping device 20. The positioning mechanism 70 includes a mounting plate 76, two sliding members 77, a support member 71, four clip poles 73 arranged at opposite sides of the support member 71, and a cylinder assembly 75 controlling the clip poles 73. The mounting plate 76 is fixed to the working surface 11 of the base body 10. The cylinder assembly 75 is substantially rectangular, and positioned on the mounting plate 76. The sliding members 77 are slidably positioned on opposite sides of the cylinder assembly 75, and driven to slide by the cylinder assembly 75. Two clip poles 73 are positioned on one sliding member 77, and another two clip poles 73 are positioned on the other sliding member 77.

Referring to FIGS. 1 to 8, in operation, a first substrate 200 is delivered to the support member 71 of the positioning mechanism 70. The cylinder assembly 75 drives the sliding members 77 to slide close to each other, thereby directing the clip poles 73 closely to position the first substrate 200. A manipulator (not shown) transfers the first substrate 200 to the stripping plate 25 of the first stripping device 20, and the first stripping device 20 strips the film therefrom. A second substrate 300 is positioned at the stripping plate 35 of the second stripping device 30, and the second stripping device 30 strips the film therefrom. The loading mechanism 40 slides to the first stripping device 20, the first loading plate 451 receives a first substrate 200, the loading mechanism 40 slides to the second stripping device 30, and the second loading plate 453 receives a second substrate 300. The loading mechanism 40 slides to one of the vacuum laminators 50, transferring the first substrate 200 and the second substrate 300 into the vacuum laminator 50 via the entrance 511, at which time the first stripping device 20 and the second stripping device 30 can strip protective films from another first substrate 200 and another second substrate 300. The loading mechanism 40 can, accordingly, deliver another first substrate 200 and second substrate 300 to another vacuum laminator 50 immediately following delivery of the preceding first substrate 200 and second substrate 300. Different first substrates 200 and second substrates 300 can be introduced into the vacuum laminators 50, and each of the members of the bonding apparatus 100 has a high utilization and manufacturing efficiency.

There can, alternatively, be three or more vacuum laminators 50. The number employed is decided according to the delivery time of the loading mechanism 40 transferring a first substrate 200 and a second substrate 300, and the bonding time of the vacuum laminator 50 and sizes of each members of the bonding apparatus 100.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A bonding apparatus for bonding a first substrate and a second substrate, the bonding apparatus comprising:
a base body;
a first stripping device, wherein the first stripping device comprises a fixing bracket perpendicularly positioned on a top surface of the base body, a material discharging member rotatably connected to the fixing bracket, a stripping plate movably connected to the fixing bracket, an adhesive tape surrounding the discharging member and the stripping plate, and a pressing member movably arranged on the fixing bracket and opposite to the stripping plate;
a second stripping device arranged on the base body;
a plurality of vacuum laminators arranged in a line on the base body; and
a loading mechanism comprising a slide-rail on the base body and a loading member slidably connected to the slide-rail;
wherein the loading member transfers the first substrate and the second substrate from the first stripping device and the second stripping device to one vacuum laminator, and slides on the slide-rail to transfer another first substrate and another second substrate from the first stripping device and the second stripping device to another vacuum laminator.

2. The bonding apparatus of claim 1, wherein the loading mechanism is arranged between the first stripping device and one vacuum laminator.

3. The bonding apparatus of claim 2, wherein the loading mechanism further comprises an adjustment assembly slidably connecting with the slide-rail, to which and along with which the loading member is fixed and moves.

4. The bonding apparatus of claim 3, wherein the loading member comprises a first loading plate and a second loading plate connecting with the first loading plate.

5. The bonding apparatus of claim 1 further comprising an unloading mechanism, wherein the loading mechanism and the unloading mechanism are arranged at opposite sides of one vacuum laminator.

6. The bonding apparatus of claim 5, wherein the unloading mechanism comprises a slide-rail on the base body and an unloading member slidably connecting with the slide-rail.

7. The bonding apparatus of claim 1 further comprising a positioning mechanism comprising a support member and a plurality of clip poles arranged at opposite sides thereof.

8. The bonding apparatus of claim 7, wherein the positioning mechanism further comprises a cylinder assembly controlling the clip poles.

9. The bonding apparatus of claim 1, wherein the first stripping device further comprises a material collecting member rotatably connecting with the fixing bracket.

10. A stripping device, comprising:
a fixing bracket,
a material discharging member rotatably connected to the fixing bracket,
a stripping plate movably connected to the fixing bracket;
an adhesive tape surrounding the discharging member and the stripping plate, and
a pressing member movably arranged on the fixing bracket and opposite to the stripping plate.

11. The stripping device of claim 10, further comprising a material collecting member rotatably connecting with the fixing bracket.

* * * * *